United States Patent
Kim et al.

(10) Patent No.: US 8,446,753 B2
(45) Date of Patent: May 21, 2013

(54) REFERENCE CELL WRITE OPERATIONS AT A MEMORY

(75) Inventors: Jung Pill Kim, San Diego, CA (US); Hari M. Rao, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 250 days.

(21) Appl. No.: 12/731,204

(22) Filed: Mar. 25, 2010

(65) Prior Publication Data

US 2011/0235391 A1 Sep. 29, 2011

(51) Int. Cl.
G11C 11/00 (2006.01)
G11C 11/14 (2006.01)
G11C 11/15 (2006.01)

(52) U.S. Cl.
USPC ........... 365/148; 365/158; 365/163; 365/171; 365/173

(58) Field of Classification Search
USPC .......................... 365/148, 158, 163, 171, 173
See application file for complete search history.

(56) References Cited

U.S. PATENT DOCUMENTS

| 6,487,128 | B2 | 11/2002 | Bohm et al. | |
|---|---|---|---|---|
| 6,778,445 | B2 | 8/2004 | Ooishi et al. | |
| 6,809,976 | B2 | 10/2004 | Ooishi | |
| 6,947,315 | B2 * | 9/2005 | Iwata | 365/158 |
| 7,167,389 | B2 | 1/2007 | Iwata | |
| 7,286,394 | B2 * | 10/2007 | Ooishi | 365/158 |
| 7,423,898 | B2 * | 9/2008 | Tanizaki et al. | 365/148 |
| 7,453,719 | B2 * | 11/2008 | Sakimura et al. | 365/158 |
| 7,609,543 | B2 * | 10/2009 | Yang et al. | 365/158 |
| 7,830,705 | B2 * | 11/2010 | Jeong | 365/163 |
| 7,864,563 | B2 * | 1/2011 | Shimizu et al. | 365/158 |
| 7,952,916 | B2 * | 5/2011 | Maeda et al. | 365/158 |
| 8,058,698 | B2 * | 11/2011 | Horng et al. | 365/158 |
| 8,120,126 | B2 * | 2/2012 | Lee et al. | 365/171 |
| 2009/0016100 | A1 | 1/2009 | Jeong | |
| 2009/0201710 | A1 | 8/2009 | Ueda | |
| 2009/0237977 | A1 | 9/2009 | Ramani et al. | |
| 2010/0067282 | A1 | 3/2010 | Liu et al. | |

OTHER PUBLICATIONS

International Search Report and Written Opinion—PCT/US2011/029967, ISA/EPO—May 17, 2011.

* cited by examiner

*Primary Examiner* — Trong Phan
(74) *Attorney, Agent, or Firm* — Sam Talpalatsky; Nicholas J. Pauley; Joseph Agusta

(57) ABSTRACT

A method of selecting a reference circuit for a write operation is disclosed. The method comprises selecting a reference circuit for a write operation based on an output of a row decode circuit and a column decode circuit. The reference circuit is programmed concurrently with a write operation of at least one of a plurality of memory cells in a memory array without requiring an external reference circuit write command.

40 Claims, 8 Drawing Sheets

US 8,446,753 B2

REFERENCE CELL WRITE OPERATIONS AT A MEMORY

I. FIELD

The present disclosure is generally related to a reference cell write operation at a memory.

II. DESCRIPTION OF RELATED ART

Advances in technology have resulted in smaller and more powerful computing devices. For example, there currently exist a variety of portable personal computing devices that are small, light weight, and easily carried by users, such as personal digital assistants (PDAs), wireless telephones, and paging devices. Portable wireless telephones, such as cellular telephones and internet protocol (IP) telephones, can communicate voice and data packets over wireless networks. Further, many such wireless telephones include other types of devices that are incorporated therein. For example, a wireless telephone may also include a digital still camera, a digital video camera, a digital recorder, and an audio file player. Such wireless telephones can execute instructions of software applications, such as a web browser application, to access the Internet. Therefore, wireless telephones can include significant computing capabilities.

The aforementioned portable personal computing devices include memory for storing data related to the use and operation of the particular device. Resistance based memories, such as Spin Torque Transfer Magnetic Random Access Memory (STT-MRAM), provide high density, high speed, long term non-volatile data storage. Writing reference cells for each reference cell of a resistance based memory may be a time consuming endeavor and may require a dedicated reference cell write command. A dedicated external reference cell write command may add costs to the system.

III. SUMMARY

Embodiments of the present disclosure provide an apparatus and method of writing a data value at a reference cell of a resistance based memory concurrently with writing a data value at a memory cell of the resistance based memory. Each of the reference cells is selectable for a write operation based on an output of a row decode circuit and on an output of a column decode circuit, thus enabling the reference cells to be programmed concurrently with and in response to programming of the data cells. As a result, the programming of the reference cells may be accomplished in a more convenient manner.

In a particular embodiment, a non-volatile memory is disclosed. The non-volatile memory comprises a plurality of memory cells. The non-volatile memory also comprises first write circuitry to write a logic one value to a first reference cell and second write circuitry to write a logic zero value to a second reference cell. The non-volatile memory also comprises a column decode circuit and a row decode circuit. Each of the reference cells is selectable for a write operation based on an output of the row decode circuit and the column decode circuit.

In another particular embodiment, a non-volatile memory is disclosed. The non-volatile memory comprises a memory array comprising a plurality of memory cells and reference lines. At least one of the reference lines is associated with a reference cell that is programmable concurrently with a write operation of one of the plurality of the memory cells in the memory array in response to receiving a write command and without requiring a dedicated reference cell write command.

In another particular embodiment, a non-volatile memory is disclosed. The non-volatile memory comprises a plurality of memory cells. Each of the plurality of memory cells comprises a resistance based memory element. The non-volatile memory comprises first write circuitry to write a logic one value to a first reference cell. The first reference cell comprises a first resistance based memory element. The non-volatile memory comprises second write circuitry to write a logic zero value to a second reference cell. The second reference cell comprises a second resistance based memory element. The non-volatile memory also comprises a column decode circuit and a row decode circuit. Each of the reference cells is selectable for a write operation based on a first output of the row decode circuit and based on a second output of the column decode circuit. Each reference cell is programmable concurrently with a write operation of one of the plurality of the memory cells in response to receiving a write command without requiring a dedicated reference cell write command.

In another particular embodiment, a method is disclosed. The method comprises selecting a reference circuit for a write operation based on a first output of a row decoder circuit and a second output of a column decode circuit. The method further comprises programming the reference circuit concurrently with a write operation of at least one of a plurality of memory cells in a memory array in response to receiving a write command and without requiring a dedicated reference circuit write command.

One particular advantage provided by at least one of the disclosed embodiments is that performance of a resistance based memory device may be improved by reliably writing a data value at a reference cell of a resistance based memory such as an STT-MRAM cell without requiring a dedicated reference cell write command. By not requiring a dedicated reference cell write command to program the reference cells, the programming of the reference cells may be accomplished in a more expedient manner.

IV. BRIEF DESCRIPTION OF THE DRAWINGS

Figure 7:
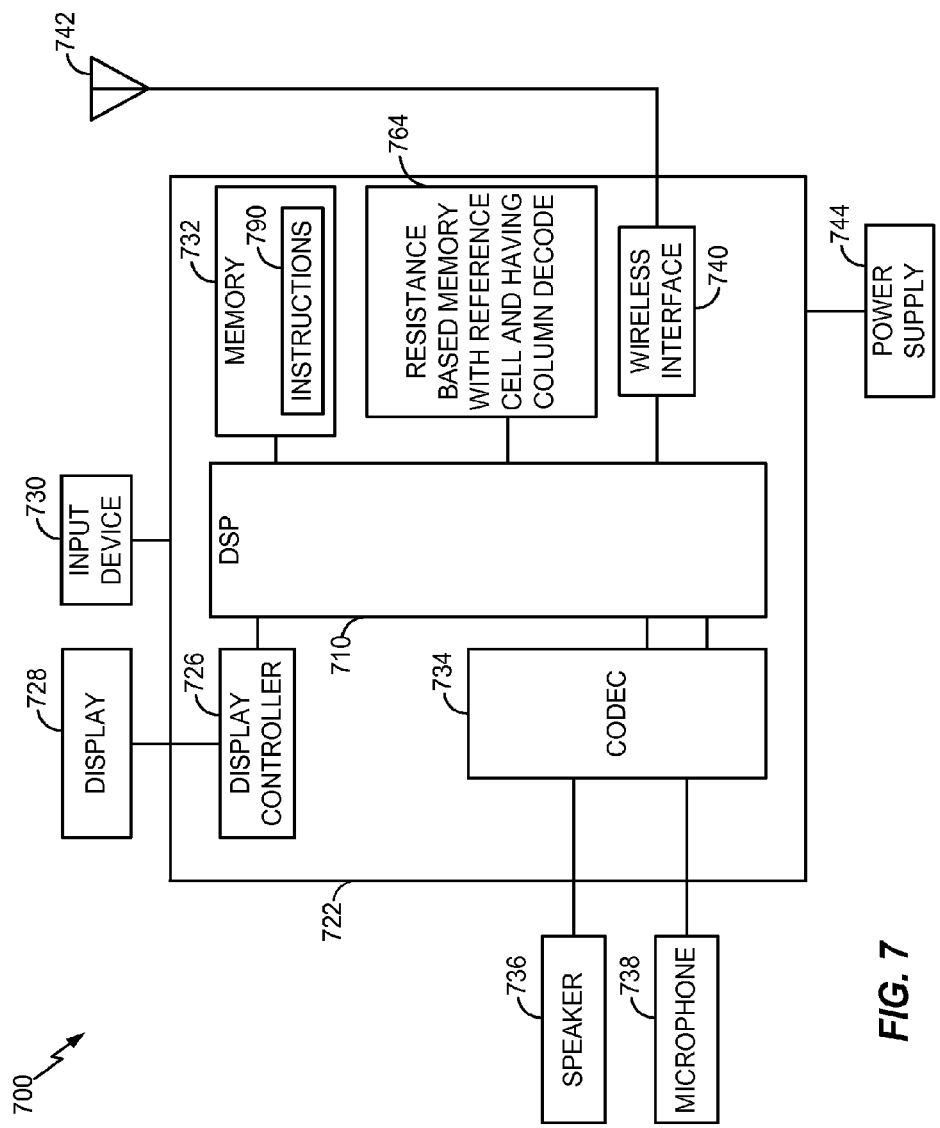
Figure 8:
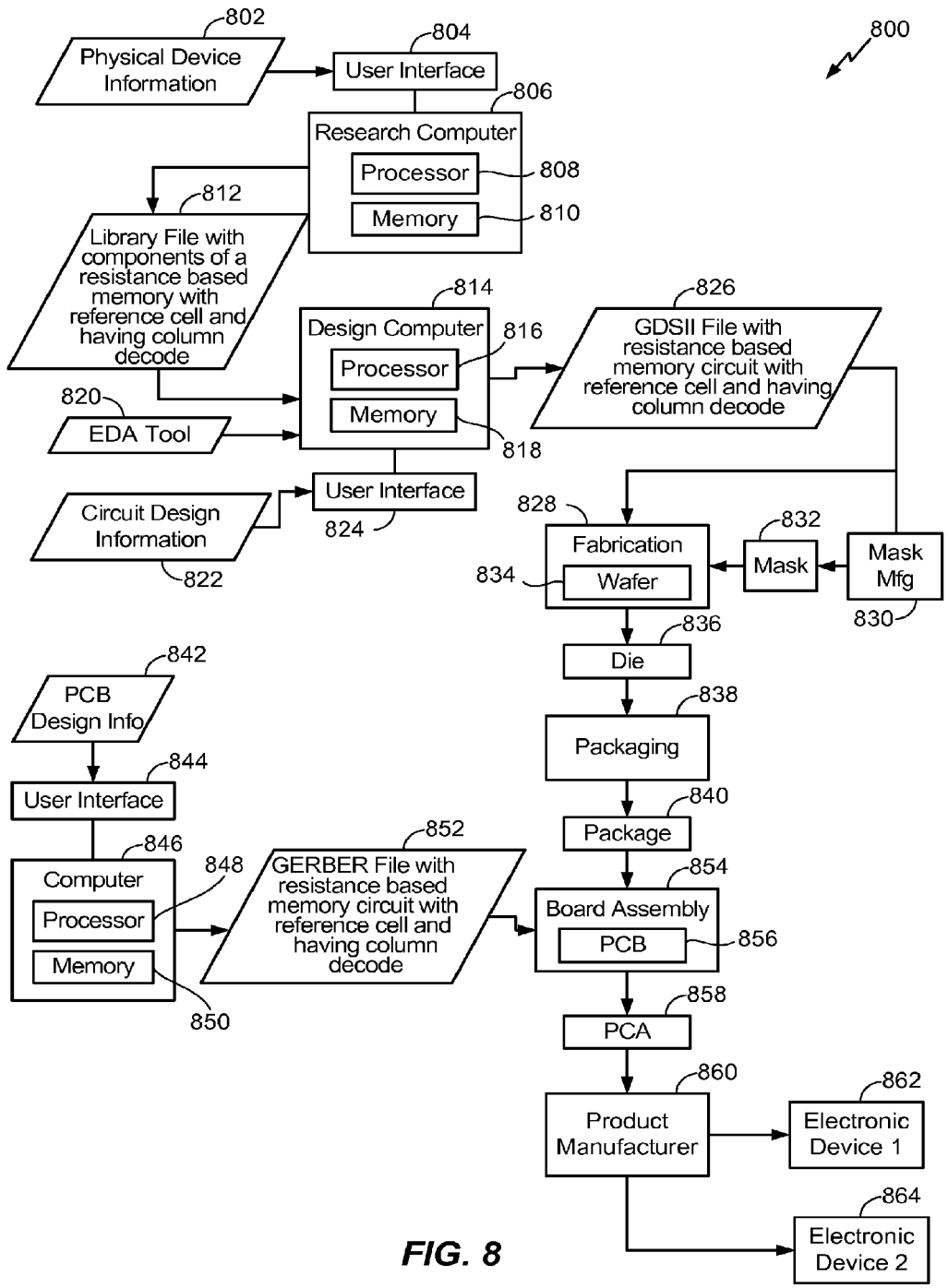

FIG. 7 is a block diagram of a particular illustrative embodiment of a wireless device including a resistance based memory circuit including a reference circuit and having a column decode circuit; and FIG. 8 is a data flow diagram of a particular illustrative embodiment of a manufacturing process to manufacture electronic devices that include a resistance based memory circuit including a reference circuit and having a column decode circuit.

V. DETAILED DESCRIPTION

Figure 1:
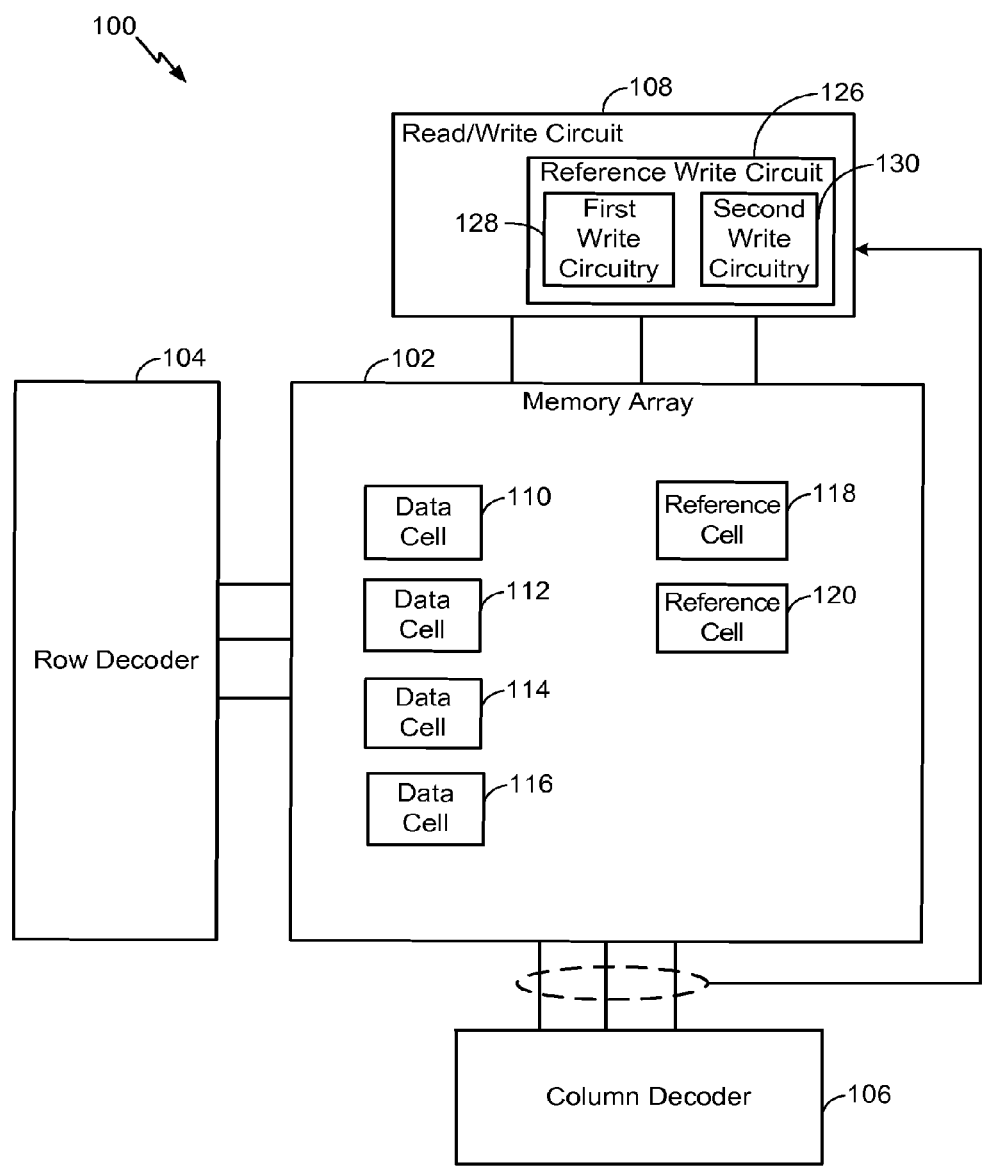
FIG. 1 is a block diagram of an illustrative embodiment of a resistance based memory circuit with a reference cell and having a column decode circuit.

Referring to FIG. 1, a particular illustrative embodiment of a resistance based memory circuit with a reference cell and having a column decode is depicted and generally designated 100. The resistance based memory 100 includes a memory array 102 and a row decoder circuit 104 coupled to the memory array 102. The memory array 102 includes a plurality of memory or data cells 110-116 and a plurality of reference cells 118, 120. The memory array 102 is coupled to a read/write circuit 108 and to a column decoder circuit 106. The read/write circuit 108 includes a reference write circuit 126. The reference write circuit 126 includes first write circuitry 128 and second write circuitry 130. The column decode circuit 106 is coupled to the read/write circuit 108 so that write operations may be performed at the reference cells 118, 120 in response to an output of the row decoder circuit 104 and an output of the column decoder circuit 106, thus enabling the reference cells 118, 120 to be programmed concurrently with and in response to programming the data cells 110-116. As a result the programming of the reference cells may be accomplished in a more expedient manner.

In a particular embodiment, the memory array 102 is a resistance based memory such as a magnetoresistive random access memory (MRAM), a phase-change random access memory (PRAM), or a spin torque transfer MRAM (STT-MRAM). The data cells 110-116 and the reference cells 118, 120 each include a resistance based memory element such as a magnetic tunnel junction (MTJ) device.

During operation, the read/write circuit 108 is adapted to write a data value, such as a logic one value or a logic zero value, to each of the data cells 110-116 individually or in combination based on selected rows and columns. The reference write circuit 126 is adapted to write a logic one value via the first write circuitry 128 to a first reference cell 118 and is adapted to write a logic zero value via the second write circuitry 130 to a second reference cell 120. Each of the reference cells 118, 120 is selectable for a write operation based on a first output of the row decoder circuit 104 and on a second output of the column decoder circuit 106. At least one of the reference cells 118, 120 is programmable concurrently with one of the data cells 110-116 during a write operation of at least one of the data cells 110-116 in response to receiving a write command from the read/write circuit 108 without requiring a dedicated reference circuit write command to be received from an external source. As a result, programming of the reference cells may be accomplished in a more expedient manner than in systems that program reference cells separately from data cells in response to a dedicated write command. In addition, by triggering reference writes with data writes, aging effects of the reference cells may more closely track the data cells, resulting in enhanced reliability.

Figure 2:
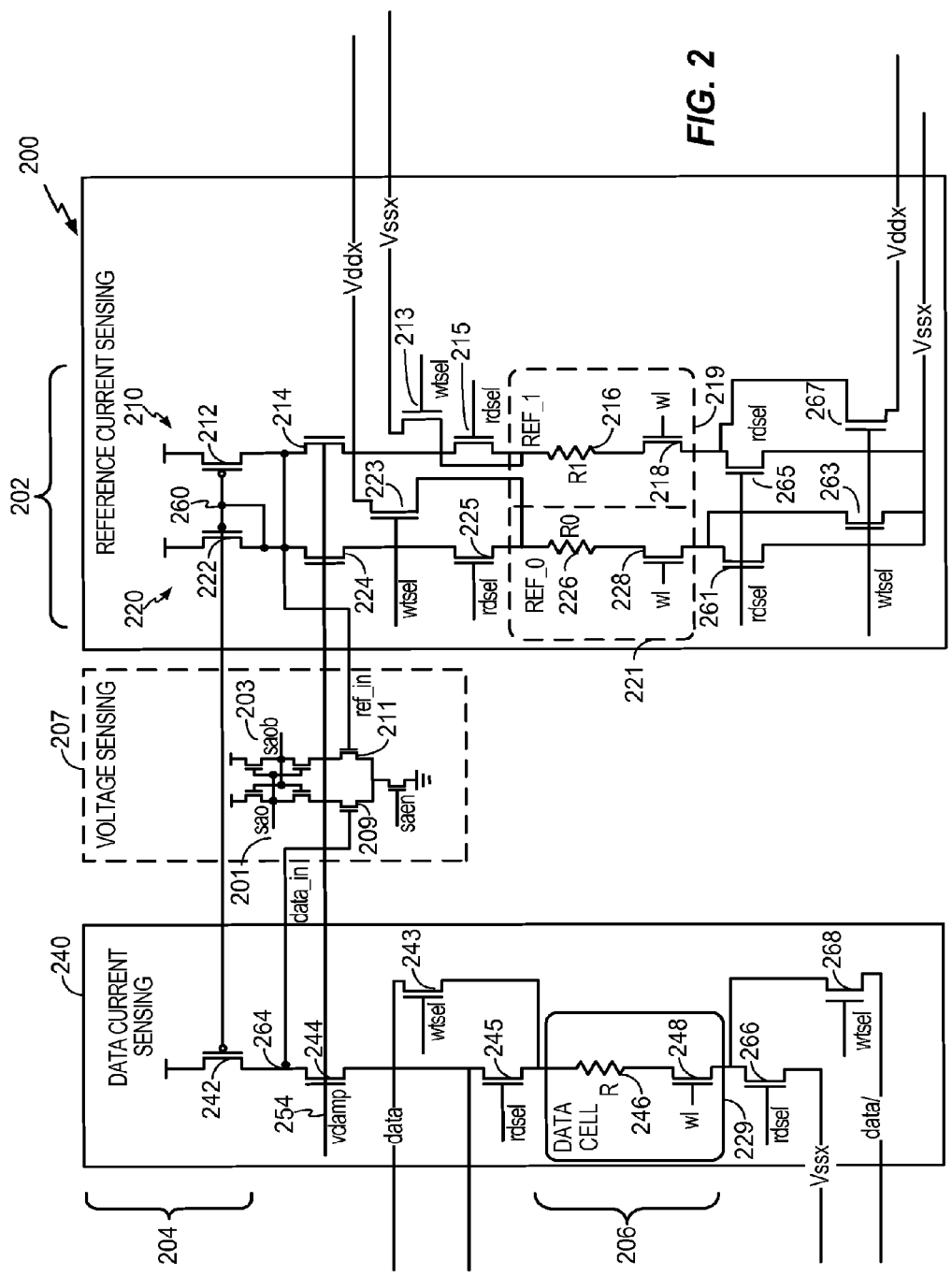
FIG. 2 is a circuit diagram of an illustrative embodiment of a resistance based memory circuit including a sense amplifier configured to compare a data value of a memory cell to a reference data value of a reference circuit.

Referring to FIG. 2, a particular illustrative embodiment of a resistance based memory circuit including a sense amplifier configured to compare a data value of a memory cell to a reference data value of a reference circuit is depicted and generally designated 200. The resistance based memory 200 includes a reference circuit 202 having a first reference path 210 and a second reference path 220. The resistance based memory 200 also includes a data path 240. The reference paths 210, 220 and the data path 240 are generally designated as having a first sense amplifier portion 204 that provides load elements to a memory cell portion 206 to generate an output signal for comparison at a second sense amplifier portion 207. In a particular embodiment, the resistance based memory 200 is a magnetoresistive random access memory (MRAM), a phase-change random access memory (PRAM), or a spin torque transfer MRAM (STT-MRAM).

The first reference path 210 includes a load device, such as a p-channel metal oxide semiconductor (PMOS) field effect transistor load 212. The PMOS load 212 is coupled to a first reference node 260, which in turn is coupled to a clamp transistor 214. A first read select transistor 215 is coupled to the clamp transistor 214. A resistance based memory element 216 having a resistance R1 corresponding to a logic "one" state of the resistance based memory element 216 is coupled to the first read select transistor 215 and is also coupled to a write select transistor 213. A resistance based memory element is a device having a first resistance corresponding to a logic "one" value and a second resistance corresponding to a logic "zero" value, such as a magnetic tunnel junction (MTJ) device or a PRAM memory cell as illustrative, non-limiting examples. An access transistor 218 is coupled to the resistance based memory element 216. A second read select transistor 265 is coupled to the access transistor 218. A second write select transistor 267 is coupled to the access transistor 218.

The second reference path 220 includes a load device, such as a PMOS load 222. The PMOS load 222 is coupled to the first reference node 260, which in turn is coupled to a clamp transistor 224. A third read select transistor 225 is coupled to the clamp transistor 224. A resistance based memory element 226 having a resistance R0 corresponding to a logic "zero" state of the resistance based memory element 226 is coupled to the read select transistor 225 and is also coupled to a third write select transistor 223. An access transistor 228 is coupled to the resistance based memory element 226. A fourth read select transistor 261 is coupled to the access transistor 228. A fourth write select transistor 263 is coupled to the access transistor 228. A first reference cell 221 includes the resistance based memory element 216, the access transistor 218 of the first reference path 210, the resistance based memory element 226, and the access transistor 228 of the second reference path 220.

The data path 240 includes a load device, such as a PMOS load 242. The PMOS load 242 is coupled to a second reference node 264, which in turn is coupled to a clamp transistor 244. A first read select transistor 245 is coupled to the clamp transistor 244. The first read select transistor 245 is responsive to a read select signal (rdsel). A resistance based memory element 246 having a resistance R corresponding to a logic state of the resistance based memory element 246 is coupled to the first read select transistor 245 and is also coupled to a first write select transistor 243. A gate of the first write select transistor 243 is responsive to a write select signal (wtsel). An access transistor 248 is coupled to the resistance based memory element 246. A second read select transistor 266 is coupled to the access transistor 248. A second write select transistor 268 is coupled to the access transistor 248. A drain of the first write select transistor 243 is coupled to receive a first data signal (data) and a source of the second write select transistor 268 is coupled to receive a second data signal (data/). A data cell 229 includes the resistance based memory element 246 and the access transistor 248 of the data path 240.

Generally, corresponding components of each of the paths 210, 220, 240 may have similar configurations and may operate in a substantially similar manner. Each of the clamp transistors 214, 224, and 244 functions to limit current and voltage through the respective paths 210, 220, and 240 based on a signal Vclamp 254. The signal Vclamp 254 represents a common gate voltage that enables the clamp transistors 214, 224, and 244 to function as clamping transistors. Each of the access transistors 218, 228, and 248 selectively allows current flow through the respective paths 210, 220, and 240 based on a common signal $V_{WL}$ that represents a common gate voltage to the access transistors 218, 228, and 248. Each of the PMOS load devices 212, 222, and 242 has a gate terminal that is coupled to the first reference node 260 such that a gate voltage equals a voltage Vref at the first reference node 260.

The resistance based memory element 226 and the resistance based memory element 246 may be concurrently written when a logic zero is to be stored at the resistance based memory element 246, or the resistance based memory element 216 and the resistance based memory element 246 may be concurrently written when a logic one is to be stored at the resistance based memory element 246. In a particular embodiment, both the resistance based memory element 216 and the resistance based memory element 226 may be programmed concurrently with the resistance based memory element 246 by applying the appropriate voltages to the write select transistor 213, the second write select transistor 267, the third write select transistor 223, and the fourth write select transistor 263. In a particular embodiment, the write select transistor 213 and the write select transistor 267 comprise first write circuitry, and the third write select transistor 223 and the fourth write select transistor 263 comprise second write circuitry.

The second sense amplifier portion 207 is a voltage sense amplifier that is responsive to a sense amplifier enable signal (saen) and that includes a data transistor 209 that is coupled to receive a data signal data_in corresponding to a voltage at the second reference node 264. The second sense amplifier portion 207 also includes a reference transistor 211 that is also coupled to receive a reference signal ref_in corresponding to a voltage at the first reference node 260. In a particular embodiment, the voltage at the first reference node 260 is a reference data value that corresponds to a reference voltage less than a logic one value associated with the resistance based memory element R1 216 and greater than a logic zero value associated with the resistance based memory element R0 226. For example, the reference data value may be substantially at a midpoint of a reference voltage associated with a logic one value associated with the resistance based memory element R1 216 and a reference voltage associated with a logic zero value associated with the resistance based memory element R0 226. The data signal data_in is compared to the reference signal ref_in based on respective voltage values to determine a state of the reference cell (e.g., differential voltage sensing). The second sense amplifier portion 207 is configured to generate an output Sao 201, Saob 203 in response to the comparison of the data signal data_in and the reference signal ref_in.

Figure 3:
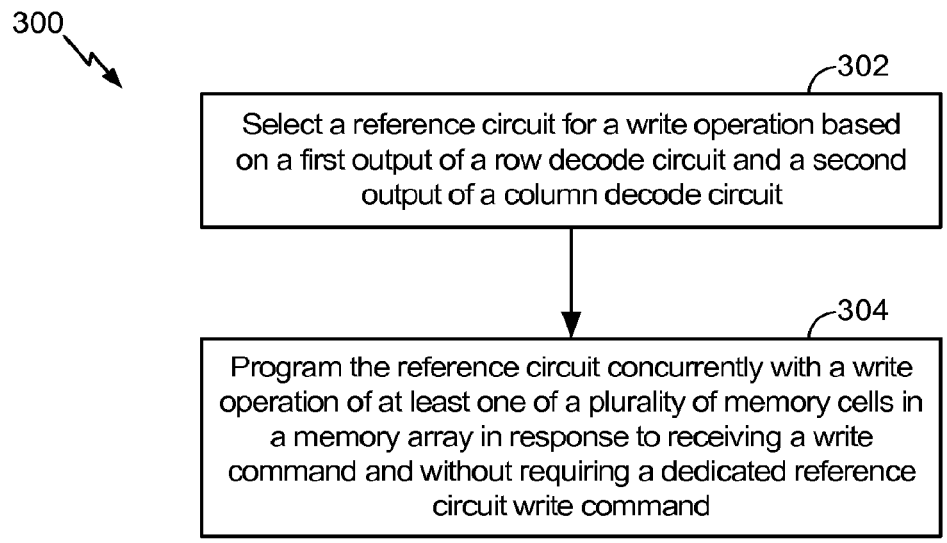
FIG. 3 is a flow diagram of a first illustrative embodiment of a method of selecting a reference circuit for a write operation.

Referring to FIG. 3, a flow diagram of a first illustrative embodiment of a method of selecting a reference circuit for a write operation is depicted and generally designated 300. The method 300 may be performed by components of the system 100 of FIG. 1, by components of the system 200 of FIG. 2, by other resistance based memory data sensing systems or devices, or any combination thereof.

A reference circuit is selected for a write operation based on an output of a row decode circuit and a column decode circuit, at 302. In a particular embodiment, the reference circuit includes the reference cells 118, 120 of FIG. 1, the row decode circuit is the row decoder circuit 104 of FIG. 1, and the column decode circuit is the column decoder circuit 106 of FIG. 1. The reference circuit is programmed concurrently with a write operation of at least one of a plurality of memory cells in a memory array without requiring an external reference circuit write command, at 304. For example, the resistance based memory element 226 and the resistance based memory element 246 may be concurrently written when a logic zero is to be stored at the resistance based memory element 246, or the resistance based memory element 216 and the resistance based memory element 246 may be concurrently written when a logic one is to be stored at the resistance based memory element 246. In a particular embodiment, both the resistance based memory element 216 and the resistance based memory element 226 may be programmed concurrently with the resistance based memory element 246 by applying the appropriate voltages to the write select transistor 213, the second write select transistor 267, the third write select transistor 223, and the fourth write select transistor 263. For example, a first voltage (Vssx) may be applied to the write select transistor 213 and to the fourth write select transistor 263. A second voltage (Vddx) may be applied to the second write select transistor 267 and to the third write select transistor 223.

Performance of a resistance based memory device may be improved by reliably writing a data value at a reference cell of a resistance based memory such as an MRAM cell without requiring a dedicated reference cell write command because programming of the reference cells may be accomplished in a more expedient manner. In addition, by triggering reference writes with data writes, aging effects of the reference cells may more closely track the data cells, resulting in enhanced reliability.

Figure 4:
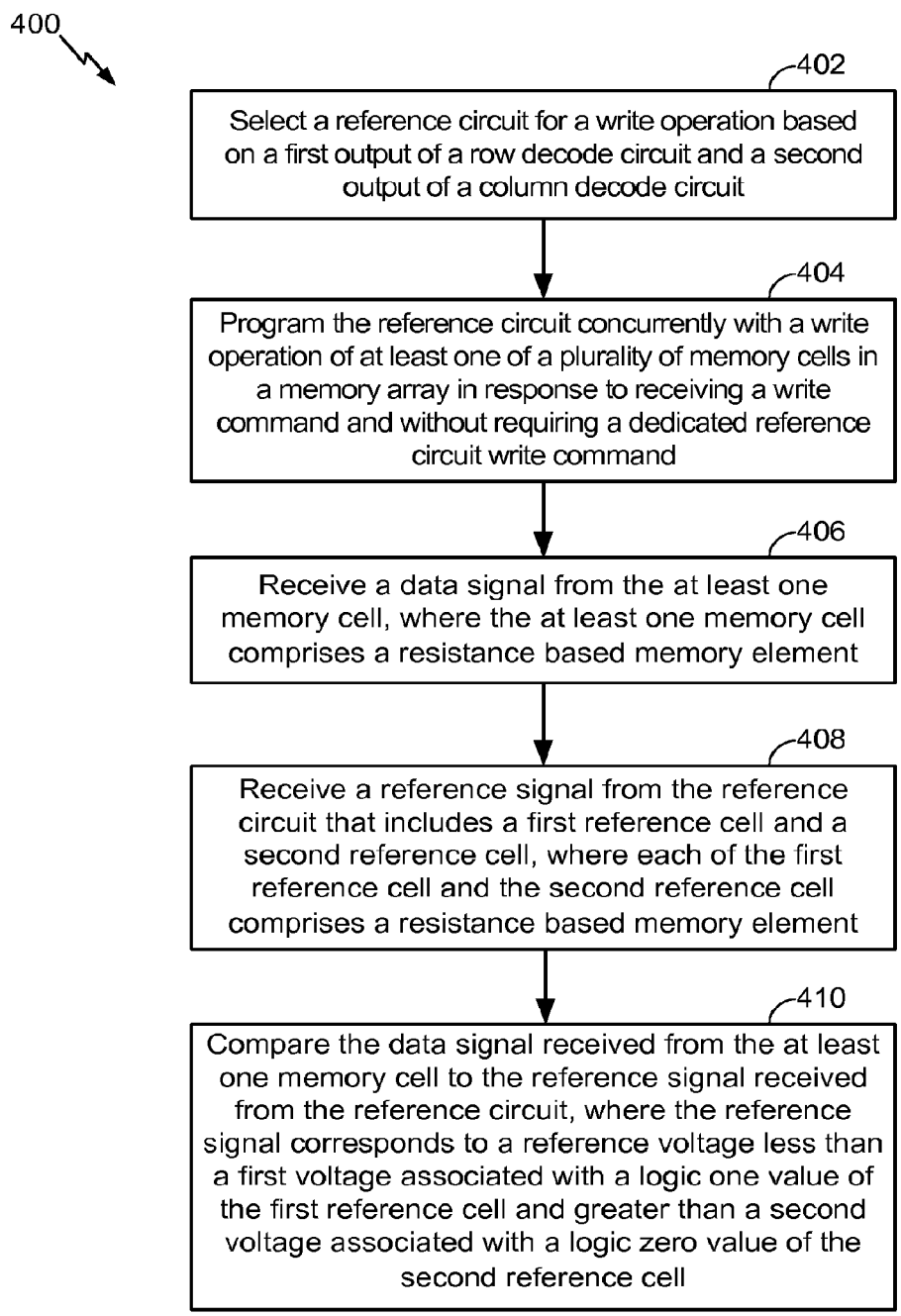
FIG. 4 is a flow diagram of a second illustrative embodiment of a method of selecting a reference circuit for a write operation.

Referring to FIG. 4, a flow diagram of a second illustrative embodiment of a method of selecting a reference circuit for a write operation is depicted and generally designated 400. The method 400 may be performed by components of the system 100 of FIG. 1, by components of the system 200 of FIG. 2, by other resistance based memory data sensing systems or devices, or any combination thereof.

A reference circuit is selected for a write operation based on an output of a row decode circuit and a column decode circuit, at 402. In a particular embodiment, the reference circuit includes the reference cells 118, 120 of FIG. 1, the row decode circuit is the row decoder circuit 104 of FIG. 1, and the column decode circuit is the column decoder circuit 106 of FIG. 1. The reference circuit is programmed concurrently with a write operation of at least one of a plurality of memory cells in a memory array in response to receiving a write command and without requiring a dedicated reference circuit write command to be received from an external source, at 404. A data signal from the at least one memory cell is received, where the at least one memory cell comprises a resistance based memory element, at 406. In a particular embodiment, the memory cell is one of the data cells 110-116 of FIG. 1 or the data cell 206 of FIG. 2, and the resistance based memory element is a magnetic tunnel junction (MTJ) device.

A reference signal is received from the reference circuit that includes a first reference cell and a second reference cell, where each of the first reference cell and the second reference cell comprises a resistance based memory element, at 408. In a particular embodiment, the first reference cell is reference cell 116 of FIG. 1 and the second reference cell is reference cell 118 of FIG. 1. The data signal received from the at least one memory cell is compared to the reference signal received from the reference circuit, at 410. In a particular embodiment, the reference signal corresponds to a reference voltage less than a logic one value associated with the first reference cell and greater than a logic zero value associated with the second reference cell.

As a result, programming of the reference cells may be accomplished in a more expedient manner than in systems that program reference cells separately from data cells in response to a dedicated write command. In addition, by triggering reference writes with data writes, aging effects of the reference cells may more closely track the data cells, resulting in enhanced reliability.

Figure 5:
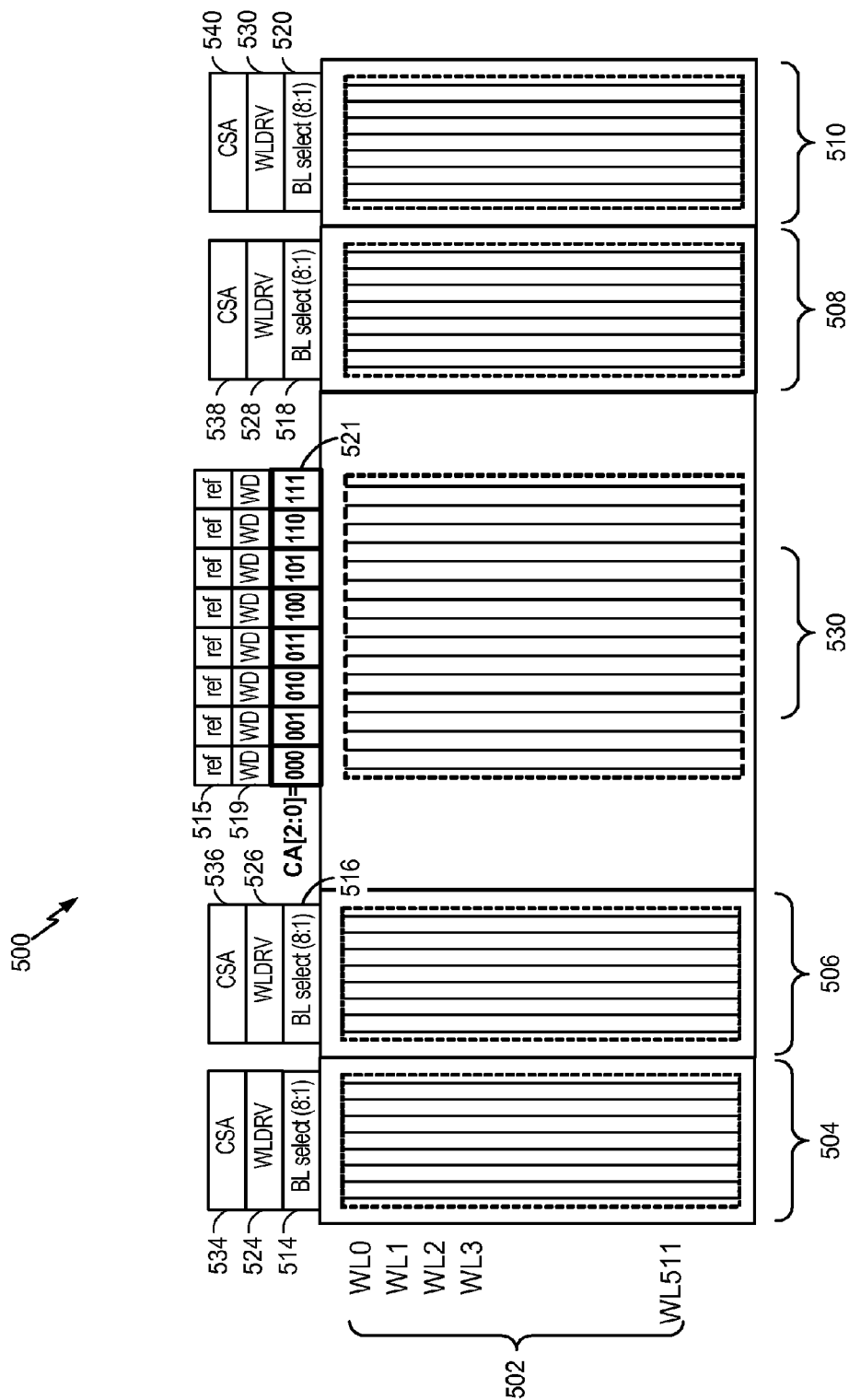
FIG. 5 is a block diagram of a particular illustrative embodiment of a memory layout of a resistance based memory circuit with a reference cell and having a column decode circuit.

Referring to FIG. 5, a block diagram of a particular illustrative embodiment of a memory layout of a resistance based memory circuit with a reference cell and having a bit line select circuit is depicted and generally designated 500. The resistance based memory circuit 500 comprises a plurality of word lines 502 (i.e., WL0, WL1, WL2, WL3, . . . , WL511) and a plurality of bit lines 504-510 associated with memory cells of the resistance based memory circuit 500. Each group of bit lines 504-510 is coupled to a respective bit line select circuit 514-520 and to a respective sense amplifier circuit 534-540. For example, the bit lines 504 are coupled to the bit line select circuit 514 and to the sense amplifier circuit 534, the bit lines 506 are coupled to the bit line select circuit 516 and to the sense amplifier circuit 536, etc. The bit line select circuits 514-520 may be responsive to a column decode signal. Write driver circuits 524-530 are associated with the memory cells of the resistance based memory circuit 500.

The resistance based memory circuit 500 further comprises a plurality of bit lines 530 associated with a plurality of reference cells of the resistance based memory circuit 500. Each of the reference cells is coupled to the bit lines 530. In a particular embodiment, each of the reference cells is located adjacent to another one of the reference cells, and is coupled to two bit lines, where one bit line is associated with a logic one value and the other bit line is associated with a logic zero value (e.g. as illustrated in FIG. 2). Each of the reference cells is coupled to a write driver circuit 519 and to a bit line select circuit 521. Each write driver circuit 519 is coupled to a reference current sensing circuit 515.

During operation, each of the reference cells is selectable for a write operation based on a first output of the bit line select circuit 521 and on a second output of the write driver circuit 519. At least one of the reference cells is programmable concurrently with at least one of a plurality of data cells during a write operation of at least one of the plurality of data cells in response to receiving a write command without requiring a dedicated reference circuit write command. For example, the three least significant column address bits [2:0] may be received at each bit line select circuit 514-520 to select one of eight bit lines and may be received at the bit line select circuit 521 to select at least one of the reference bit lines 530 coupled to one of the reference cells.

Because reference cells may be written whenever a memory write operation occurs, write current may increase as compared to writing the reference cells once via a dedicated reference cell write command received from an external source. However, by triggering reference writes with data writes, aging effects of the reference cells may more closely track the data cells, resulting in enhanced reliability.

Figure 6:
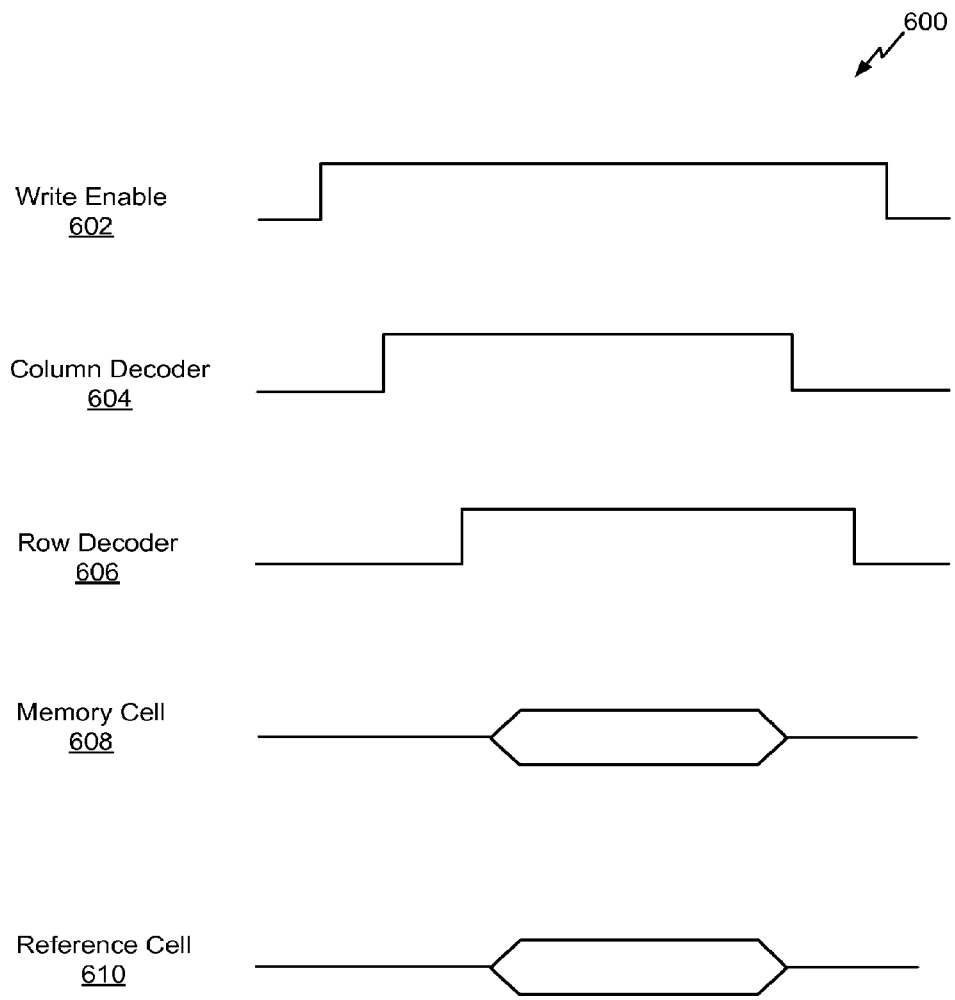
FIG. 6 is a timing diagram of a particular illustrative embodiment of programming a reference cell concurrently with a write operation of a memory cell at a resistance based memory circuit with a reference cell and having a column decode circuit.

Referring to FIG. 6, a diagram of a particular illustrative embodiment of a resistance based memory circuit with a reference cell having a column decode circuit that illustrates programming the reference cell concurrently with a write operation of a memory cell is depicted and generally designated 600. Illustrated in FIG. 6 are a write enable signal 602, a column decoder circuit signal 604, a row decoder circuit signal 606, a memory cell write signal 608, and a reference cell write signal 610. As shown in FIG. 6, in response to the write enable signal 602, the column decoder circuit signal 604, and the row decoder signal 606 being active, the memory cell write signal 608 and the reference cell write signal 610 are concurrently active, where a reference cell is programmable concurrently with a write operation of a memory cell.

Referring to FIG. 7, a block diagram of a particular illustrative embodiment of an electronic device, such as a wireless phone, including a resistance based memory circuit with a reference cell and having a column decode circuit, as described herein, is depicted and generally designated 700. The device 700 includes a processor, such as a digital signal processor (DSP) 710, coupled to a memory 732 and also coupled to a resistance based memory circuit with a reference cell and having a column decode circuit 764. In an illustrative example, the resistance based memory circuit with a reference cell and having a column decode circuit 764 includes the resistance based memory 100 depicted in FIG. 1, or the resistance based memory 200 depicted in FIG. 2. In a particular embodiment, the resistance based memory circuit with a reference cell and having a column decode circuit 764 includes a spin torque transfer magnetoresistive random access memory (STT-MRAM) memory device.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless interface 740 can be coupled to the digital signal processor 710 and to a wireless antenna 742. In a particular embodiment, the DSP 710, the display controller 726, the memory 732, the CODEC 734, the wireless interface 740, and the resistance based memory circuit with a reference cell and having a column decode circuit 764 are included in a system-in-package or system-on-chip 722. In a particular embodiment, an input device 730 and a power supply 744 are coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each can be coupled to a component of the on-chip system 722, such as an interface or a controller.

In a particular embodiment, the DSP 710 executes processor-readable program instructions from a processor-readable medium, such as instructions 790 stored at the memory 732. For example, the memory 732 may be readable by the DSP 710 and the instructions 790 may be operational instructions that are executable by the DSP 710 to perform the method 400 of FIG. 4. For example, the instructions 790 may include instructions that are executable by the DSP 710 to select a reference circuit for a write operation based on an output of a row decode circuit and a column decode circuit of the resistance based memory circuit with a reference cell having a column decode circuit 764. For example, the reference circuit may be the reference cells 118, 120 of FIG. 1, the row decode circuit may be the row decoder circuit 104 of FIG. 1, and the column decode circuit may be the column decoder circuit 106 of FIG. 1. The instructions 790 may further include instructions that are executable by the DSP 710 to program the reference circuit concurrently with a write operation of at least one of a plurality of memory cells in a memory array without requiring an external reference circuit write command.

The instructions 790 may further include instructions that are executable by the DSP 710 to receive a data signal from the at least one memory cell, where the at least one memory cell comprises a resistance based memory element. For example, the memory cell may be one of the data cells 110-116 of FIG. 1 or the data cell 206 of FIG. 2, and the resistance based memory element is a magnetic tunnel junction (MTJ) device. The instructions 790 may further include instructions that are executable by the DSP 710 to receive a reference signal from the reference circuit that includes a first reference cell and a second reference cell. Each of the first reference cell and the second reference cell comprises a resistance based memory element. In a particular embodiment, the first reference cell is reference cell 116 of FIG. 1 and the second reference cell is reference cell 118 of FIG. 1. The instructions 790 may further include instructions that are executable by the DSP 710 to receive the data signal from the at least one memory cell and compare it to the reference signal received from the reference circuit. In a particular embodiment, the reference signal corresponds to a reference voltage less than a logic one value associated with the first reference cell and greater than a logic zero value associated with the second reference cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as device components to be used in the system 100 of FIG. 1, the system 200 of FIG. 2, or any combination thereof. For example the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of design files representing semiconductor devices that may be used in components of the system 100 of FIG. 1, the system 200 of FIG. 2, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including a resistance based memory circuit with a reference cell and having a column decode circuit, such as the system 100 of FIG. 1, the system 200 of FIG. 2, or the electronic device 700 that includes the resistance based memory circuit with a reference cell and having a column decode circuit 764. For example, a user of the design computer 814 may enter circuit design information 822 via a user interface 824 coupled to the design computer 814. The circuit design information 822 may include design information representing at least one physical property of a semiconductor device, such as device components to be used in the system 100 of FIG. 1, the system 200 of FIG. 2, or the electronic device 700 that includes the resistance based memory circuit with a reference cell and having a column decode circuit 764, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822 to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the device components to be used in the system 100 of FIG. 1, the system 200 of FIG. 2, or any combination thereof, in addition to other circuits or information. To illustrate, the data file may include information corresponding to a system-on-chip (SOC) that includes the electronic device 700 of FIG. 7 and that also includes additional electronic circuits and components within the SOC.

The GDSII file 826 may be received at a fabrication process 828 to manufacture the device components to be used in the system 100 of FIG. 1, the system 200 of FIG. 2, components of the electronic device 700 of FIG. 7, or any combination thereof, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the device components to be used in the system 100 of FIG. 1, the system 200 of FIG. 2, the electronic device 700 of FIG. 7, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board. The packaged semiconductor device may correspond to the package 840 including the device components to be used in the system 100 of FIG. 1, the system 200 of FIG. 2, the electronic device 700 of FIG. 7, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the device components to be used in the system 100 of FIG. 1, the system 200 of FIG. 2, the electronic device 700 of FIG. 7, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a represented printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-8 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the device components to be used in the system 100 of FIG. 1, the system 200 of FIG. 2, the electronic device 700 of FIG. 7, or any combination thereof, may be fabricated, processed, and incorporated into an electronic device, as described in the illustrative process 800. One or more aspects of the embodiments disclosed with respect to FIGS. 1-8 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or software executing by a processor depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), magnetoresistive random access memory (MRAM), phase-change random access memory (PRAM), or spin torque transfer MRAM (STT-MRAM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A non-volatile memory comprising:
   a plurality of memory cells;
   a first reference circuit;
   a second reference circuit, wherein the first reference circuit and the second reference circuit are coupled to a common word line;
   circuitry configured to:
     program first magnetic tunnel junction (MTJ) elements of the first reference circuit; and
     program second MTJ elements of the second reference circuit;
   a column decode circuit; and
   a row decode circuit;
   wherein the first reference circuit is configured to be concurrently programmable with a write operation of a memory cell of the plurality of memory cells and the second reference circuit is configured to be programmable independently from the write operation of the memory cell based on at least one column address bit that corresponds to the memory cell and that is provided by the column decode circuit, and wherein the first reference circuit and the second reference circuit are selectable for the write operation based on an output of the row decode circuit and the at least one column address bit that corresponds to the memory cell.

2. The memory of claim 1, wherein the first reference circuit is coupled to a first pair of bit lines and the second reference circuit is coupled to a second pair of bit lines.

3. The memory of claim 1, wherein the first reference circuit is configured to be concurrently programmable with the write operation of the memory cell and the second reference circuit is configured to be programmable independently from the write operation of the memory cell based on three least significant column address bits that correspond to the memory cell and that are provided by the column decode circuit 2.

4. The memory of claim 1, wherein the circuitry configured to program the first MTJ elements includes four write select transistors.

5. The memory of claim 1, further comprising a sense amplifier configured to compare a data value of a memory cell to a reference data value that is based on at least one of the first reference circuit or the second reference circuit.

6. The memory of claim 2, wherein the first reference circuit is selected to be programmed by the circuitry when the column decode circuit selects a column address associated with the first pair of bit lines.

7. The memory of claim 1, integrated in at least one semiconductor die.

8. The memory of claim 1, further comprising a device selected from the group consisting of a set top box, a music player, a video player, an entertainment unit, a navigation device, a communications device, a personal digital assistant (PDA), a fixed location data unit, and a computer, into which the memory is integrated.

9. A non-volatile memory comprising:
a plurality of memory cells in a memory array; and
at least one reference circuit programmable concurrently with a write operation of one of the plurality of the memory cells in the memory array in response to receiving a write command and without requiring a dedicated reference circuit write command, wherein the at least one reference circuit is associated with at least one reference line of the memory array.

10. The memory of claim 9, further comprising a column decode circuit coupled to the at least one reference circuit, wherein the at least one reference circuit is selectable to be programmed concurrently with the write operation based at least in part on an output of the column decode circuit.

11. The memory of claim 9, further comprising a sense amplifier configured to compare a data value of one of the plurality of memory cells to a reference data value that is based on at least one of a first reference circuit or a second reference circuit.

12. The memory of claim 11, wherein the first reference circuit is coupled to a first pair of bit lines and the second reference circuit is coupled to a second pair of bit lines.

13. The memory of claim 12, wherein the reference data value corresponds to a reference voltage, wherein the reference voltage is less than a first voltage corresponding to a first bit line of the first pair of bit lines and greater than a second voltage corresponding to a second bit line of the first pair of bit lines.

14. The memory of claim 9, wherein each of the plurality of memory cells comprises a resistance based memory element and wherein the at least one reference circuit comprises at least two resistance based memory elements.

15. The memory of claim 14, wherein each resistance based memory element comprises a magnetic tunnel junction (MTJ) element of a spin transfer torque magnetoresistive random access memory (STT-MRAM).

16. The memory of claim 9, integrated in least one semiconductor die.

17. The memory of claim 9, further comprising a device selected from the group consisting of a set top box, a music player, a video player, an entertainment unit, a navigation device, a communications device, a personal digital assistant (PDA), a fixed location data unit, and a computer, into which the memory is integrated.

18. A non-volatile memory comprising:
a plurality of memory cells;
a first reference circuit;
a second reference circuit;
a column decode circuit; and
a row decode circuit;
wherein the first reference circuit and the second reference circuit are selectable for a write operation based on a first output of the row decode circuit and on a second output of the column decode circuit and are programmable concurrently with a write operation of one of the plurality of the memory cells in response to receiving a write command without requiring a dedicated reference circuit write command.

19. The memory of claim 18, further comprising a sense amplifier configured to compare a data value of one of the plurality of memory cells to a reference data value that is based on least one of the first reference circuit or the second reference circuit.

20. The memory of claim 18, integrated in at least one semiconductor die.

21. The memory of claim 18, further comprising a device selected from the group consisting of a set top box, a music player, a video player, an entertainment unit, a navigation device, a communications device, a personal digital assistant (PDA), a fixed location data unit, and a computer, into which the memory is integrated.

22. A method comprising:
selecting a reference circuit for a write operation based on a first output of a row decode circuit and a second output of a column decode circuit; and
programming the reference circuit concurrently with a write operation of at least one memory cell of a plurality of memory cells in a memory array in response to receiving a write command and without requiring a dedicated reference circuit write command.

23. The method of claim 22, further comprising:
receiving a data signal from the at least one memory cell, wherein the at least one memory cell comprises a resistance based memory element;
receiving a reference signal from the reference circuit, wherein the reference circuit comprises at least two resistance based memory elements; and
comparing the data signal received from the at least one memory cell to the reference signal received from the reference circuit.

24. The method of claim 23, wherein each resistance based memory element comprises a magnetic tunnel junction (MTJ) device.

25. An apparatus comprising:
a memory comprising:
means for selecting a reference circuit for a write operation based on a first output of a row decode circuit and a second output of a column decode circuit; and
means for programming the reference circuit concurrently with a write operation of at least one of a plurality of memory cells in a memory array in response to receiving a write command and without requiring a dedicated reference circuit write command.

26. The apparatus of claim 25, integrated in at least one semiconductor die.

27. The apparatus of claim 25, further comprising a device selected from the group consisting of a set top box, a music player, a video player, an entertainment unit, a navigation device, a communications device, a personal digital assistant (PDA), a fixed location data unit, and a computer, into which the memory is integrated.

28. A method comprising:
a first step for selecting a reference circuit for a write operation based on a first output of a row decode circuit and a second output of a column decode circuit; and
a second step for selectively programming the reference circuit concurrently with a write operation of at least one of a plurality of memory cells in a memory array in response to receiving a write command and without requiring a dedicated reference circuit write command.

29. The method of claim 28, wherein the first step and the second step are performed by a processor integrated into an electronic device.

30. A computer readable tangible medium storing instructions executable by a processor, the instructions comprising instructions that are executable by the processor to:
select a reference circuit for a write operation based on a first output of a row decode circuit and a second output of a column decode circuit; and
program the reference circuit concurrently with a write operation of at least one of a plurality of memory cells in a memory array in response to receiving a write command and without requiring a dedicated reference circuit write command.

31. The computer readable tangible medium of claim 30, wherein the processor is integrated in a device selected from the group consisting of a set top box, a music player, a video player, an entertainment unit, a navigation device, a communications device, a personal digital assistant (PDA), a fixed location data unit, and a computer.

32. A method comprising:
receiving design information representing at least one physical property of a semiconductor device, the semiconductor device comprising:
a memory array comprising a plurality of memory cells and reference lines, at least one of the reference lines associated with a reference circuit that is programmable concurrently with a write operation of one of the plurality of the memory cells in the memory array in response to receiving a write command without requiring a dedicated reference circuit write command;
transforming the design information to comply with a file format; and
generating a data file comprising the transformed design information.

33. The method of claim 32, wherein the data file comprises a GDSII format.

34. A method comprising:
receiving a data file comprising design information corresponding to a semiconductor device; and
fabricating the semiconductor device according to the design information, wherein the semiconductor device comprises:
a memory array comprising a plurality of memory cells and reference lines, at least one of the reference lines associated with a reference circuit that is programmable concurrently with a write operation of one of the plurality of the memory cells in the memory array in response to receiving a write command and without requiring a dedicated reference circuit write command.

35. The method of claim 34, wherein the data file has a GDSII format.

36. A method comprising:
receiving design information comprising physical positioning information of a packaged semiconductor device on a circuit board, the packaged semiconductor device comprising a semiconductor memory comprising:
a memory array comprising a plurality of memory cells and reference lines, at least one of the reference lines associated with a reference circuit that is programmable concurrently with a write operation of one of the plurality of the memory cells in the memory array in response to receiving a write command and without requiring a dedicated reference circuit write command; and transforming the design information to generate a data file.

37. The method of claim 36, wherein the data file has a GERBER format.

38. A method comprising:
receiving a data file comprising design information comprising physical positioning information of a packaged semiconductor device on a circuit board; and
manufacturing the circuit board configured to receive the packaged semiconductor device according to the design information, wherein the packaged semiconductor device comprises a structure comprising:
a memory array comprising a plurality of memory cells and reference lines, at least one of the reference lines associated with a reference circuit that is programmable concurrently with a write operation of one of the plurality of the memory cells in the memory array in response to receiving a write command and without requiring a dedicated reference circuit write command.

39. The method of claim 38, wherein the data file has a GERBER format.

40. The method of claim 38, further comprising integrating the circuit board into a device selected from the group consisting of a set top box, a music player, a video player, an entertainment unit, a navigation device, a communications device, a personal digital assistant (PDA), a fixed location data unit, and a computer.

* * * * *